(12) United States Patent
Ueda (10) Patent No.: US 11,037,767 B2
(45) Date of Patent: Jun. 15, 2021

(54) SUBSTRATE SUPPORT, SUBSTRATE PROCESSING APPARATUS, SUBSTRATE PROCESSING SYSTEM, AND METHOD OF DETECTING EROSION OF ADHESIVE IN SUBSTRATE SUPPORT

(71) Applicant: Tokyo Electron Limited, Tokyo (JP)

(72) Inventor: Takehiro Ueda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 20 days.

(21) Appl. No.: 16/699,268

(22) Filed: Nov. 29, 2019

(65) Prior Publication Data

US 2020/0185204 A1    Jun. 11, 2020

(30) Foreign Application Priority Data

Dec. 6, 2018 (JP) .............................. JP2018-229267

(51) Int. Cl.
*H01L 21/687* (2006.01)
*H01J 37/32* (2006.01)

(52) U.S. Cl.
CPC ... *H01J 37/32724* (2013.01); *H01J 37/32899* (2013.01); *H01J 2237/20285* (2013.01); *H01J 2237/20292* (2013.01); *H01J 2237/24585* (2013.01)

(58) Field of Classification Search
CPC ......... H01L 21/68785; H01L 21/67253; H01L 21/67109; H01L 21/6831; H01J 37/3244; H01J 37/32724; H01J 37/32449; H01J 2237/20285; H01J 37/32899; H01J 2237/20292; H01J 2237/24585
See application file for complete search history.

(56) References Cited

FOREIGN PATENT DOCUMENTS

JP          2000114358 A       4/2000

*Primary Examiner* — Yuechuan Yu
(74) *Attorney, Agent, or Firm* — Studebaker & Brackett PC (57) ABSTRACT

In a substrate support according to one exemplary embodiment, an adhesive is provided between an upper surface of a base and a lower surface of the electrostatic chuck. The base, the adhesive, and the electrostatic chuck provide a supply path for supplying a heat transfer gas between the electrostatic chuck and a substrate. The upper surface of the base defines one or more grooves. The one or more grooves are further away from a center of the upper surface than the supply path. The adhesive is provided to cover an upper end opening of each of the one or more grooves. The heat transfer gas is capable of being supplied to the one or more grooves via the supply path or a different flow path. The substrate support further includes a pressure sensor to measure pressure in the one or more grooves.

15 Claims, 11 Drawing Sheets

SUBSTRATE SUPPORT, SUBSTRATE PROCESSING APPARATUS, SUBSTRATE PROCESSING SYSTEM, AND METHOD OF DETECTING EROSION OF ADHESIVE IN SUBSTRATE SUPPORT

CROSS-REFERENCE TO RELATED APPLICATIONS

This application is based on and claims the benefit of priority from Japanese Patent Application No. 2018-229267 filed on Dec. 6, 2018, the entire contents of which are incorporated herein by reference.

TECHNICAL FIELD

Exemplary embodiments of the present disclosure relate to a substrate support, a substrate processing apparatus, a substrate processing system, and a method of detecting erosion of an adhesive in the substrate support.

BACKGROUND

A substrate processing apparatus is used in manufacturing electronic devices. The substrate processing apparatus may include an electrostatic chuck device as described in Japanese Patent Application Laid-Open Publication No. 2000-114358. The electrostatic chuck device has a base and an electrostatic chuck. The electrostatic chuck is provided on the base. An adhesive is provided between the electrostatic chuck and the base.

SUMMARY

In one exemplary embodiment, a substrate support is provided. The substrate support includes a base, an electrostatic chuck, and an adhesive. The electrostatic chuck is provided on the base. The adhesive is provided between an upper surface of the base and a lower surface of the electrostatic chuck. The base, the adhesive, and the electrostatic chuck provide a supply path for supplying a heat transfer gas between the electrostatic chuck and a substrate placed on the electrostatic chuck. The upper surface of the base defines one or more grooves. The one or more grooves are further away from the center of the upper surface than the supply path within the upper surface of the base. The adhesive is provided to cover an upper end opening of each of the one or more grooves. The heat transfer gas or another gas is capable of being supplied to the one or more grooves via the supply path or a flow path different from the supply path. The substrate support further includes a pressure sensor. The pressure sensor is provided to measure a pressure in the one or more grooves.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

DETAILED DESCRIPTION

Hereinafter, various exemplary embodiments will be described.

In one exemplary embodiment, a substrate support is provided. The substrate support includes a base, an electrostatic chuck, and an adhesive. The electrostatic chuck is provided on the base. The adhesive is provided between an upper surface of the base and a lower surface of the electrostatic chuck. The base, the adhesive, and the electrostatic chuck provide a supply path for supplying a heat transfer gas between the electrostatic chuck and a substrate placed on the electrostatic chuck. The upper surface of the base defines one or more grooves. The one or more grooves are further away from the center of the upper surface than the supply path within the upper surface of the base. The adhesive is provided to cover an upper end opening of each of the one or more grooves. The heat transfer gas or another gas is capable of being supplied to the one or more grooves via the supply path or a flow path different from the supply path. The substrate support further includes a pressure sensor. The pressure sensor is provided to measure a pressure in the one or more grooves.

In the substrate support of the above embodiment, when the erosion of the adhesive occurs, the gas leaks from the one or more grooves. Therefore, by detecting that the pressure in the one or more grooves decreases from the measured value of the pressure sensor after the gas is supplied to the one or more grooves, it is possible to detect the erosion of the adhesive.

In one exemplary embodiment, a protective tape may be provided between each of the one or more grooves and the adhesive to cover the upper end opening of each of the one or more grooves. The adhesive may cover the protective tape. In one embodiment, the protective tape is formed from a material that is more easily eroded than the adhesive by a process gas or a plasma of a process gas.

In one exemplary embodiment, the one or more grooves may be a plurality of grooves. In this embodiment, the plurality of grooves may extend in a radiation direction with respect to the center of the upper surface of the base.

In one exemplary embodiment, the one or more grooves may have a ring shape or may extend in a circumferential direction around the center of the upper surface of the base.

In one exemplary embodiment, the upper surface of the base may define a first groove that is a portion of the supply path, and one or more second grooves that are the one or more grooves.

In one exemplary embodiment, the one or more second grooves may communicate with the first groove.

In one exemplary embodiment, the one or more grooves may be separated from the supply path.

In another exemplary embodiment, a substrate processing apparatus is provided. The substrate processing apparatus includes a chamber and a substrate support. The substrate support of the substrate processing apparatus is the substrate support of any of the above-described various embodiments.

In one exemplary embodiment, the substrate processing apparatus may be a plasma processing apparatus.

In one exemplary embodiment, the substrate processing apparatus may include a gas source, a valve, and a controller. The valve is connected between the one or more grooves of the substrate support and the gas source. The controller is configured to control the valve. The controller controls the valve to close the valve in a state where the one or more grooves are filled with the gas from the gas source. The controller is configured to acquire the measured value of the pressure in the one or more grooves from the pressure sensor in a state where the valve is closed.

In one exemplary embodiment, the controller acquires a first measured value of the pressure in the one or more grooves in a state where the one or more grooves are filled with the gas from the gas source. The controller compares a second measured value that is the measured value acquired from the pressure sensor in the state where the valve is closed with the first measured value.

In still another exemplary embodiment, a substrate processing system is provided. The substrate processing system includes the substrate processing apparatus of any of the above-described various embodiments, an orienter, and a transfer device. The orienter is configured to acquire a position of a substrate therein. The transfer device is configured to transfer a substrate between the chamber and the orienter. The upper surface of the base defines a first groove that is a portion of the supply path, and one or more second grooves that are the one or more grooves. The one or more second grooves communicate with the first groove. The controller controls the transfer device to transfer the substrate placed on the electrostatic chuck to the orienter in a case where it is determined that the gas leaks from the first groove or the one or more second grooves as a result of comparison between the first measured value and the second measured value. The controller determines whether or not an error in a position of the substrate disposed on the electrostatic chuck has occurred, based on the position of the substrate within the orienter acquired by the orienter. In a case where no error in the position of the substrate disposed on the electrostatic chuck has occurred, it is detected that the erosion of the adhesive is generated such that the one or more grooves (second grooves) are exposed.

In a still further exemplary embodiment, a method of detecting erosion of an adhesive in a substrate support is provided. The substrate support is the substrate support of any of the above-described various embodiments. The method includes closing a valve in a state where the one or more grooves of the substrate support are filled with a gas from a gas source. The valve is connected between the one or more grooves and the gas source. The method further includes acquiring a measured value of a pressure in the one or more grooves in a state where the valve is closed.

In one exemplary embodiment, the method further includes acquiring a first measured value of the pressure in the one or more grooves in a state where the one or more grooves are filled with the gas from the gas source. The method further includes comparing a second measured value that is the measured value acquired from the pressure sensor in the state where the valve is closed with the first measured value.

In one exemplary embodiment, the upper surface of the base defines a first groove that is a portion of the supply path, and one or more second grooves that are the one or more grooves, and the one or more second grooves communicate with the first groove. In this embodiment, the method further includes transferring the substrate placed on the electrostatic chuck to the orienter in a case where it is determined that the gas leaks from the first groove or the one or more second grooves as a result of comparison between the first measured value and the second measured value. The method further includes determining whether or not an error in a position of the substrate disposed on the electrostatic chuck has occurred, based on the position of the substrate within the orienter acquired by the orienter.

Hereinafter, various exemplary embodiments will be described in detail with reference to the drawings. In the drawing, the same or equivalent portions are denoted by the same reference symbols.

Figure 1:
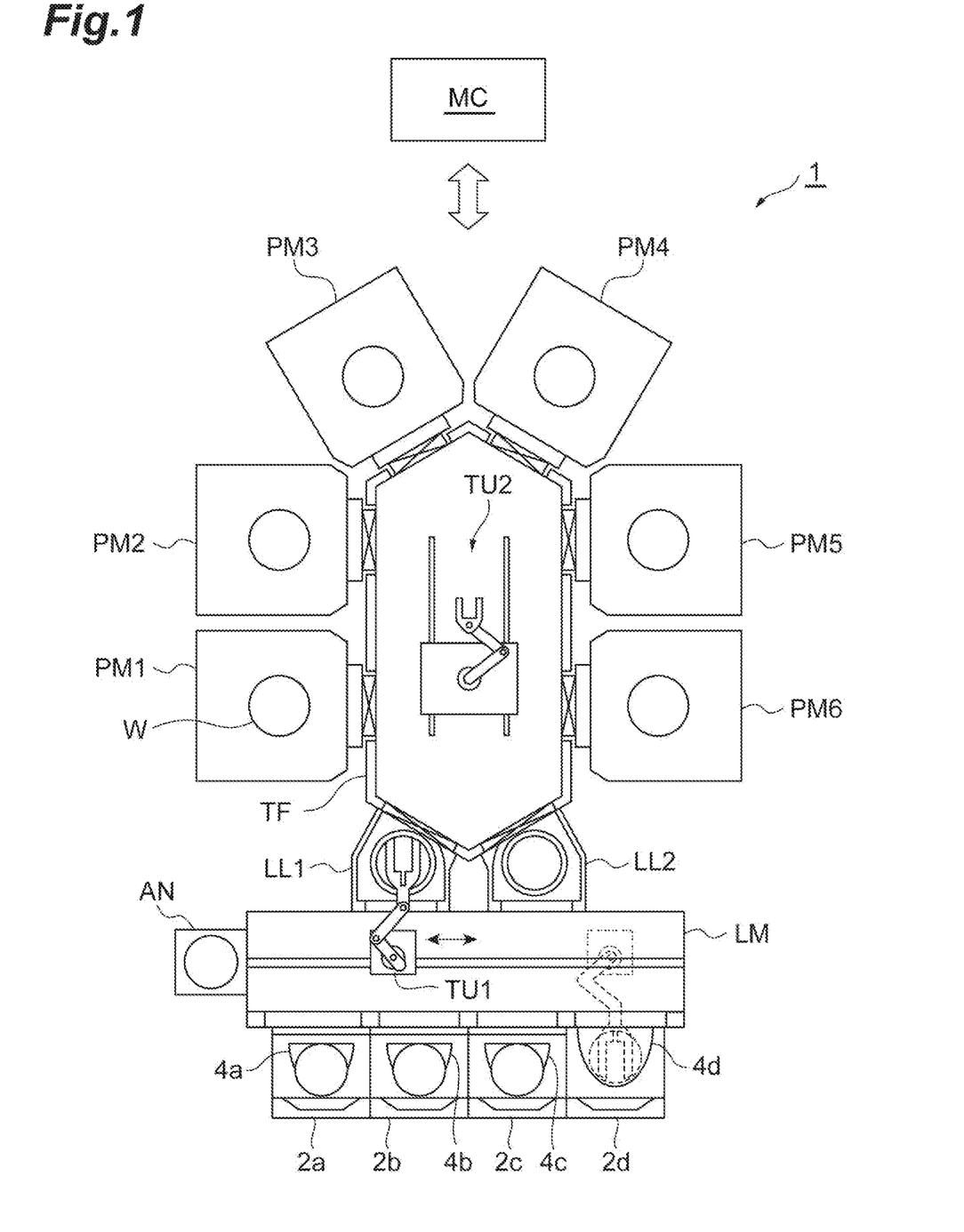
FIG. 1 schematically illustrates a substrate processing system according to one exemplary embodiment.

FIG. 1 schematically illustrates a substrate processing system according to one exemplary embodiment. The substrate processing system (hereinafter referred to as a "system 1") illustrated in FIG. 1 includes process modules PM1 to PM6, an orienter AN, a transfer device TU1, and a transfer device TU2. At least one of the process modules PM1 to PM6 is a substrate processing apparatus of any of various embodiments to be described below. The transfer device TU1 and the transfer device TU2 are configured to transfer a substrate between a chamber of the substrate processing apparatus, and the orienter AN. The orienter AN is configured to acquire the position of a substrate W therein.

In one embodiment, the system 1 includes platforms 2a to 2d, containers 4a to 4d, a loader module LM, load lock modules LL1 and LL2, a transfer module IF, and a controller MC. In addition, the number of platforms, the number of containers, and the number of load lock modules in the system 1 may be arbitrary numbers of one or more. Additionally, the number of process modules may be an arbitrary number of two or more.

The platforms 2a to 2d are arranged along one edge of the loader module LM. The containers 4a to 4d are mounted on the platforms 2a to 2d, respectively. Each of the containers 4a to 4d is, for example, a container referred to as Front Opening Unified Pod (FOUP). Each of the containers 4a to 4d is configured to house the substrate W therein.

The loader module LM has a chamber. The pressure within the chamber of the loader module LM is set to an atmospheric pressure. The transfer device TU1 is provided within the chamber of the loader module LM. The transfer device TU1 is, for example, a multi joint robot, and is controlled by the controller MC. The transfer device TU1 is configured to transfer the substrate W between the orienter AN and each of the containers 4a to 4d, between the orienter AN and each of the load lock modules LL1 to LL2, and between each of the load lock modules LL1 to LL2 and each of the containers 4a to 4d.

The orienter AN is connected to the loader module LM. As described above, the orienter AN is configured to acquire the position of the substrate W therein. The controller MC controls the transfer device TU1 and/or the transfer device TU2 in accordance with the position of the substrate W acquired by the orienter AN to dispose the substrate W a predetermined position on an electrostatic chuck of the substrate processing apparatus.

Each of the load lock module LL1 and the load lock module LL2 is provided between the loader module LM and the transfer module TF. Each of the load lock module LL1 and the load lock module LL2 provides a preliminary depressurization chamber.

The transfer module TF is connected to each of the load lock module LL1 and the load lock module LL2 via a gate valve. The transfer module TF has a chamber. A space within the chamber of the transfer module TF can be depressurized. The transfer device TU2 is provided within the chamber of the transfer module TF. The transfer device TU2 is, for example, a multi joint robot, and is controlled by the controller MC. The transfer device TU2 is configured to transfer the substrate W between each of the load lock modules LL1 to LL2, and each of the process modules PM1 to PM6 and between two arbitrary process modules of the process modules PM1 to PM6.

Each of the process modules PM1 to PM6 is configured to perform a dedicated substrate processing. Each of the process modules PM1 to PM6 provides a chamber. The chamber of each of the process modules PM1 to PM6 is connected to the chamber of the transfer module TF via a gate valve.

The controller MC may be a computer device including a processor, a storage device such as a memory, a display device, such as a display, I/O devices, such as a keyboard and a mouse, a control signal input/output interface, a communication device, and the like. Control programs and recipe data are stored in the storage device. The processor controls the respective units of the system 1 by operating in accordance with the control programs and the recipe data to send control signals to the respective units of the system 1. The controller MC is also a controller of a substrate processing apparatus of each of the various embodiments to be described below. A method according to the various embodiments to be described below is executed by the control of the respective units of the system 1 by the controller MC. In addition, details of the control of the respective units of the system 1 by the controller MC will be described below.

Figure 2:
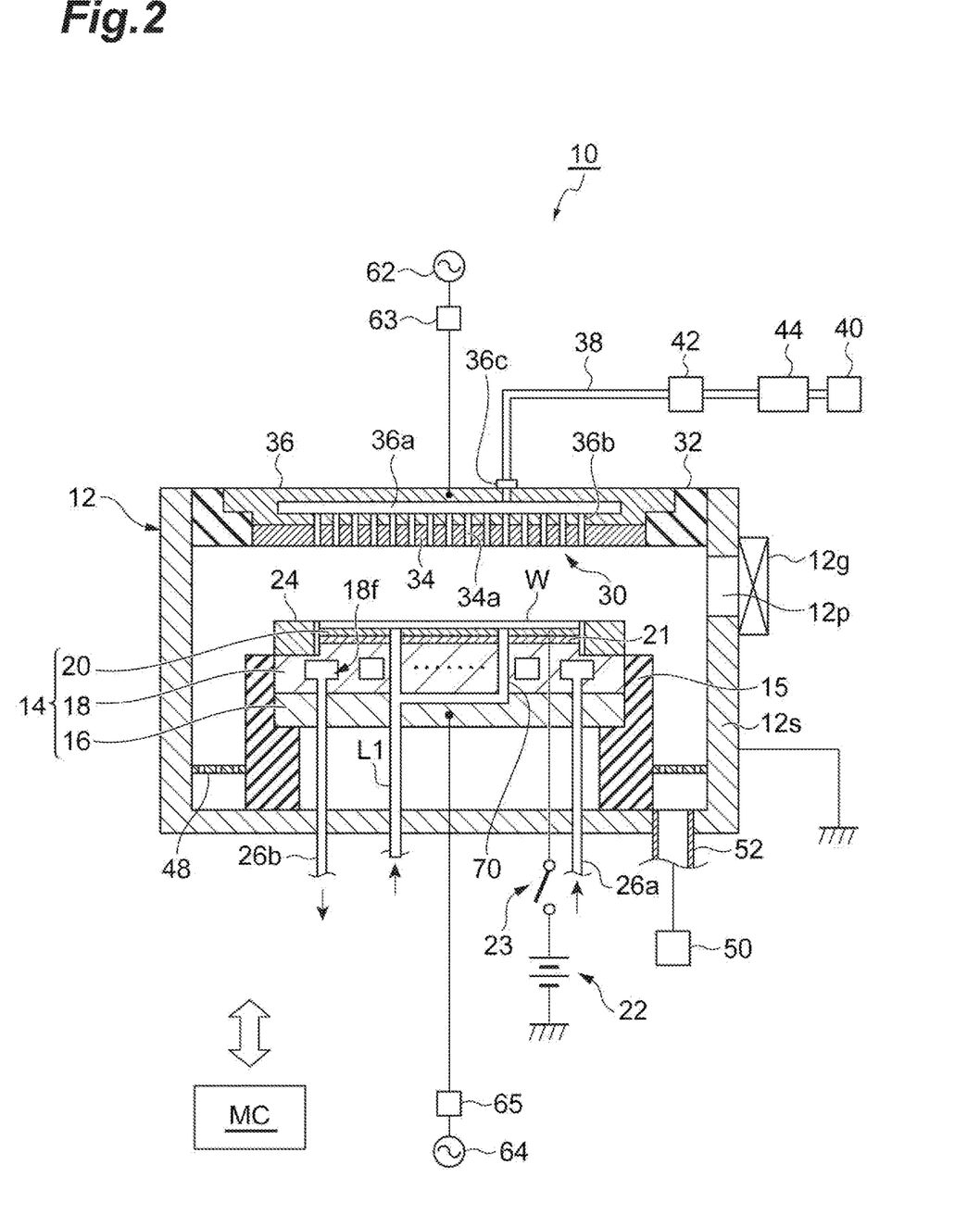
FIG. 2 schematically illustrates a substrate processing apparatus according to one exemplary embodiment.

FIG. 2 schematically illustrates a substrate processing apparatus according to one exemplary embodiment. A substrate processing apparatus 10 can be used as at least one of the process modules PM1 to PM6 of the system 1. The substrate processing apparatus 10 illustrated in FIG. 2 is a capacitively coupled plasma processing apparatus.

The substrate processing apparatus 10 includes a chamber 12. The chamber 12 has a substantially cylindrical shape. The chamber 12 is formed from a conductor, such as aluminum, and is grounded. A film having plasma resistance is formed on an inner wall surface of the chamber 12. The film may be a film formed from aluminum oxide or yttrium oxide. An opening 12p is formed in a side wall 12s of the chamber 12. The substrate W passes through the opening 12p when being transferred between the inside and the outside of the chamber 12. For opening and closing of the opening 12p, a gate valve 12g is provided along a side wall 12s of the chamber 12.

The substrate processing apparatus 10 further includes a substrate support 14. The substrate support 14 is configured to support the substrate W in the chamber 12. The substrate support 14 has a base 18 and an electrostatic chuck 20. A support assembly including the base 18 and the electrostatic chuck 20 is provided within the chamber 12. The support assembly of the substrate support 14 may further have an electrode plate 16.

The support assembly of the substrate support 14 is supported by a support 15. The support 15 is provided on a bottom part of the chamber 12. The support 15 has a substantially cylindrical shape. The support 15 is configured from, for example, an insulating material. The support 15 extends upward from the bottom part of the chamber 12 within the chamber 12.

Each of the electrode plate 16 and the base 18 is formed from, for example, metal, such as aluminum. Each of the electrode plate 16 and the base 18 has a substantially disk shape. The base 18 is provided on the electrode plate 16. The base 18 is electrically connected to the electrode plate 16. In one embodiment, the base 18 constitutes a lower electrode.

A flow path 18f is provided in the base 18. A refrigerant is supplied from a chiller unit provided outside the chamber 12 via a pipe 26a to the flow path 18f. The refrigerant supplied to the flow path 18f is returned to the chiller unit via a pipe 26b. By controlling the temperature of the refrigerant, the temperature of the substrate W on the electrostatic chuck 20 can be adjusted.

Figure 3:
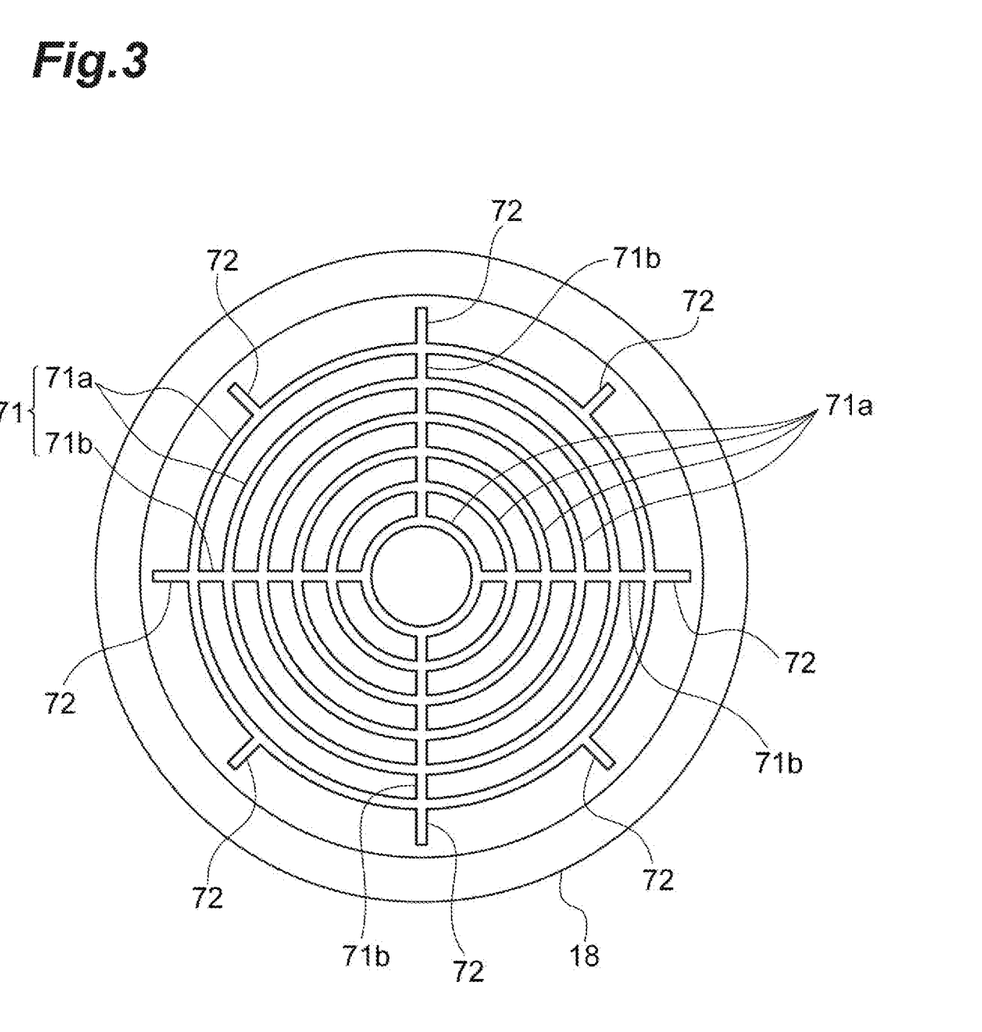
FIG. 3 is a plan view illustrating an upper surface of a base of a substrate support according to one exemplary embodiment.
Figure 4:
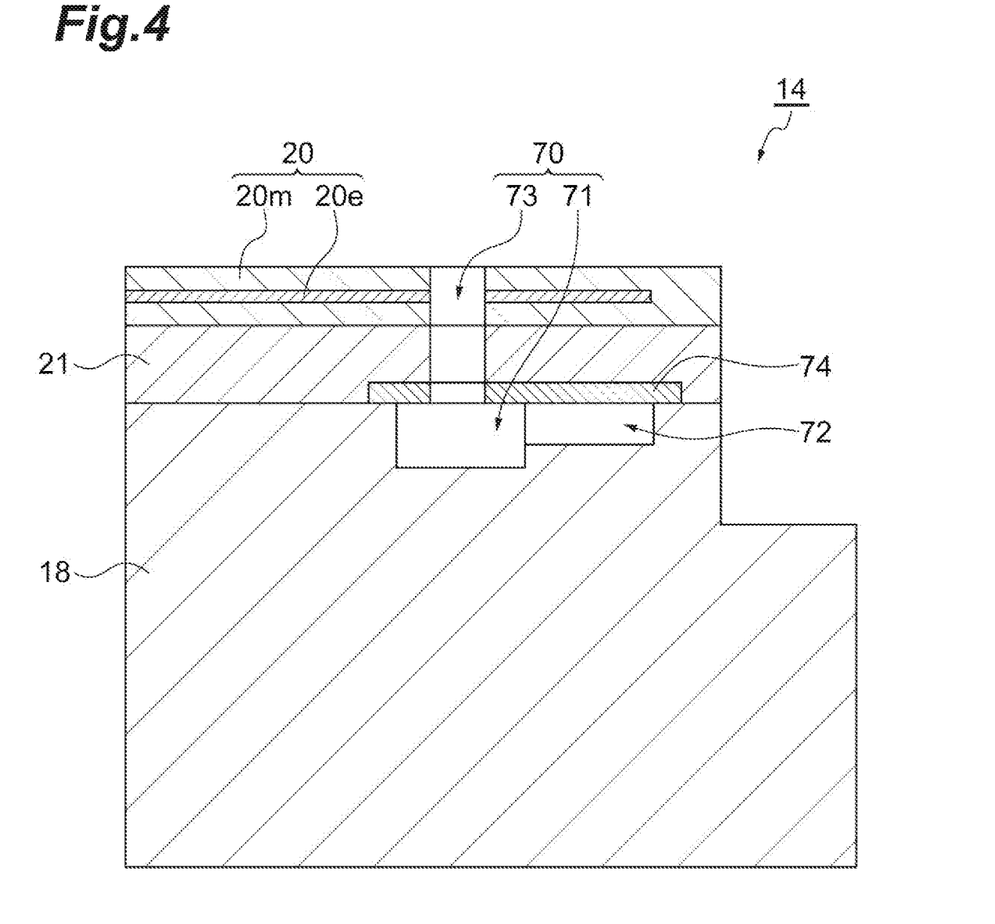
FIG. 4 is a partially enlarged sectional view of the substrate support according to the one exemplary embodiment.
Figure 5:
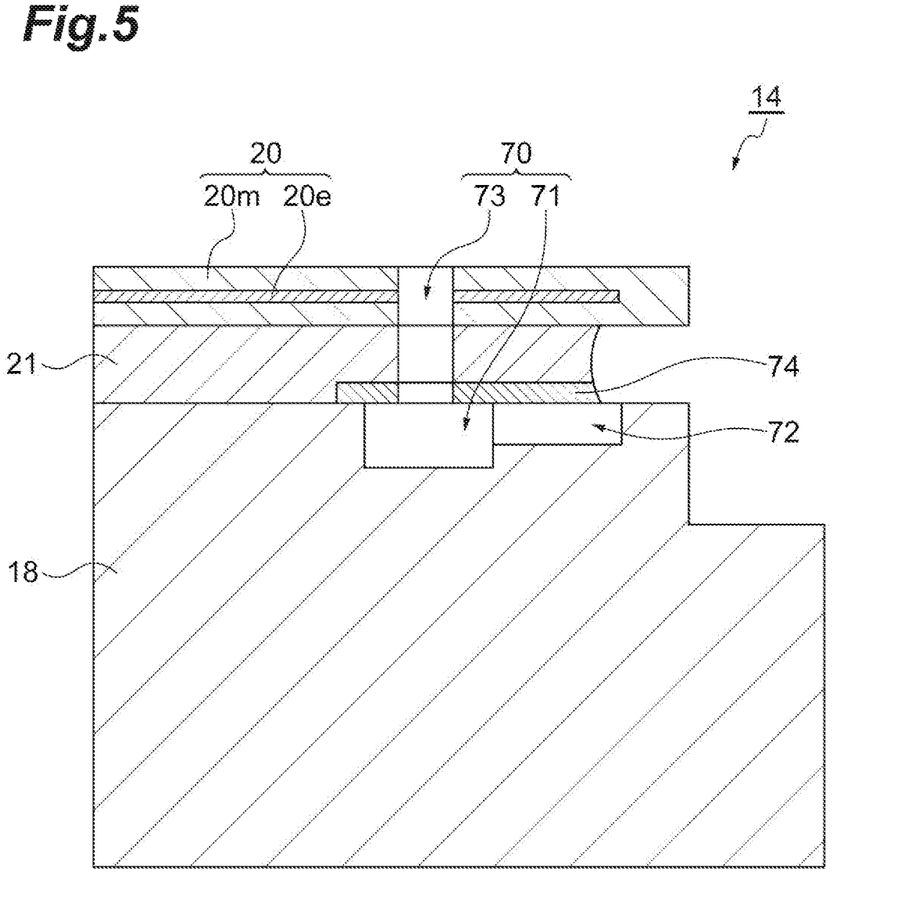
FIG. 5 is a partially enlarged sectional view of the substrate support according to the one exemplary embodiment.

Hereinafter, FIGS. 3, 4, and 5 are referred to together with FIG. 2. FIG. 3 is a plan view illustrating an upper surface of a base of the substrate support according to one exemplary embodiment. FIGS. 4 and 5 are partially enlarged sectional views of the substrate support according to the one exemplary embodiment. The electrostatic chuck 20 is provided on the base 18. An adhesive 21 is provided between the upper surface of the base 18 and a lower surface of the electrostatic chuck 20. The electrostatic chuck 20 is bonded to the base 18 with the adhesive 21.

The electrostatic chuck 20 has a main body 20m and an electrode 20e. The main body 20m of the electrostatic chuck 20 is formed from a dielectric substance, such as aluminum nitride. The main body 20m has a substantial disk shape. The electrode 20e is a film having conductivity, and is provided in the main body 20m.

A DC power source 22 is electrically connected to the electrode 20e of the electrostatic chuck 20 via a switch 23. When a direct current voltage is applied to the electrode 20e from the DC power source 22, an electrostatic attractive force is generated between the electrostatic chuck 20 and the substrate W. Due to the generated electrostatic attractive force, the substrate W is attracted the electrostatic chuck 20, and is held by the electrostatic chuck 20.

A focus ring 24 is provided on a peripheral edge of the support assembly of the substrate support 14. The focus ring 24 is a substantially annular plate. The focus ring 24 is disposed to surround the edge of the substrate W, and the electrostatic chuck 20. The focus ring 24 may be formed from, for example, a material, such as silicon, silicon carbide, or quartz.

The substrate processing apparatus 10 further includes an upper electrode 30. The upper electrode 30 is provided above the electrostatic chuck 20. The upper electrode 30 is supported on an upper portion of the chamber 12 via a member 32. The upper electrode 30 may include an electrode plate 34 and a support 36. A lower surface of the electrode plate 34 faces an internal space of the chamber 12. A plurality of gas discharge holes 34a are formed in the electrode plate 34. The electrode plate 34 may be formed from a material, such as silicon or silicon oxide.

The support 36 is configured to detachably support the electrode plate 34. The support 36 is formed from a conductive material, such as aluminum. A gas diffusion chamber 36a is provided inside the supporting body 36. A plurality of gas flow holes 36b that communicate with the gas discharge holes 34a extend downward from the gas diffusion chamber 36a. A gas inlet 36c is formed in the support 36. The gas inlet 36c communicates with the gas diffusion chamber 36a. A gas supply pipe 38 is connected to the gas inlet 36c.

A gas source group 40 is connected to the gas supply pipe 38 via a valve group 42 and a flow rate controller group 44. The gas source group 40 includes a plurality of gas sources. The valve group 42 includes a plurality of valves. The flow rate controller group 44 includes a plurality of flow rate controllers, such as massflow controllers or pressure-controlled flow rate controllers. Each of the plurality of gas sources of the gas source group 40 is connected to the gas supply pipe 38 via a corresponding valve of the valve group 42 and a corresponding flow rate controller of the flow rate controller group 44.

A baffle member 48 is provided between the support 15, and the side wall 12s of the chamber 12. The baffle member 48 is, for example, an annular and plate-shaped member. The baffle member 48 may be formed, for example, by coating the surface of an aluminum member with ceramics, such as $Y_2O_3$. A plurality of holes, which pass through the baffle member 48, are formed in the baffle member 48. Below the baffle member 48, an exhaust device 50 is connected to the bottom part of the chamber 12 via an exhaust pipe 52. The exhaust device 50 has a pressure controller, such as a pressure adjusting valve, and a vacuum pump, such as a turbo molecular pump. The exhaust device 50 can reduce the pressure inside the chamber 12 to a desired pressure.

The substrate processing apparatus 10 may further include a first radio-frequency power source 62 and a second radio-frequency power source 64. The first radio-frequency power source 62 is a power source that generates first radio-frequency power for generating a plasma. The first radio-frequency power has a frequency within a range of, for example, 27 MHz to 100 MHz. The first radio-frequency power source 62 is connected to the upper electrode 30 via a matching unit 63. The matching unit 63 has a circuit for matching the output impedance of the first radio-frequency power source 62 with the impedance of a load side (upper electrode 30 side). Alternatively, the first radio-frequency power source 62 may be connected to the base 18 (lower electrode) via the matching unit 63.

The second radio-frequency power source 64 is a power source that generates second radio-frequency power for attracting ions into the substrate W. The frequency of the second radio-frequency power is lower than the frequency of the first radio-frequency power. The second radio-frequency power has a frequency within a range of, for example, 400 kHz to 13.56 MHz. The second radio-frequency power source 64 is connected to the base 18 (lower electrode) via the matching unit 65. The matching unit 65 has a circuit for matching the output impedance of the second radio-frequency power source 64, with the impedance of the load side (base 18 side).

Figure 6:
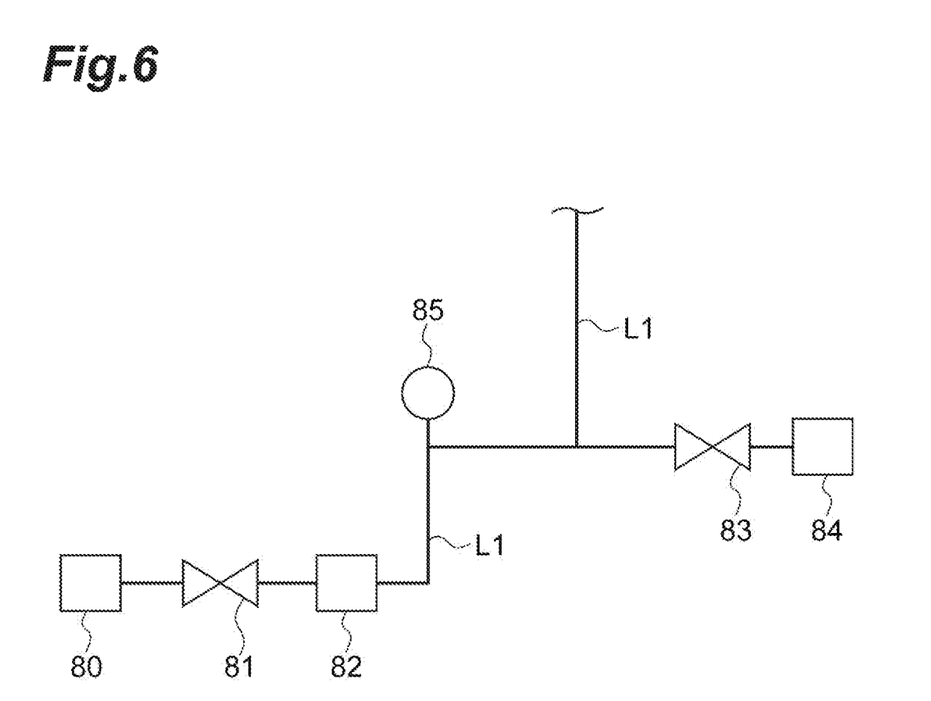
FIG. 6 illustrates a gas supply system according to one exemplary embodiment.

Hereinafter, FIG. 6 is referred to in addition to FIGS. 2, 3, 4, and 5. FIG. 6 illustrates a gas supply system according to one exemplary embodiment. As illustrated in FIG. 2, the base 18, the adhesive 21, and the electrostatic chuck 20 provide a supply path 70. The supply path 70 is a flow path that supplies a heat transfer gas (for example, helium gas) between the electrostatic chuck 20 and the substrates W placed on the electrostatic chuck 20. A gas line L1 is connected to the supply path 70.

As illustrated in FIG. 6, a gas source 80 is connected to the gas line L1 via a valve 81 and a flow rate controller 82. The gas source 80 is a source for the heat transfer gas. The flow rate controller 82 is a massflow controller or a pressure-controlled flow rate controller. When the valve 81 is opened, the heat transfer gas is supplied between the electrostatic chuck 20 and a back surface of the substrate W via the gas line L1 and the supply path 70. An exhaust device 84 is connected to the gas line L1 via a valve 83. A pressure sensor 85 is connected to the gas line L1. The pressure sensor 85 is configured to acquire a measured value of the pressure in the gas line L1. The pressure sensor 85 can acquire a measured value of the pressure in a plurality of grooves 72 to be described below by measuring the pressure in the gas line L1.

In one embodiment, the upper surface of the base 18 defines a plurality of grooves 71 (first grooves). The plurality of grooves 71 are portions of the supply path 70. The number of grooves 71 in the upper surface of the base 18 may be an arbitrary number of one or more.

In one embodiment, the plurality of grooves 71 include a plurality of grooves 71a and a plurality of grooves 71b. Each of the plurality of grooves 71a has a ring shape. The plurality of grooves 71a are provided concentrically with respect to the center of the upper surface of the base 18. The plurality of grooves 71b extend in a radiation direction (radial direction) with respect to the center of the upper surface of the base 18. The plurality of grooves 71b allow the plurality of grooves 71a to communicate with each other. The supply path 70 includes a plurality of holes 73. The plurality of holes 73 extend upward from the plurality of grooves 71 so as to pass through adhesive 21 and the electrostatic chuck 20. The plurality of holes 73 extend upward from the outermost groove 71a and/or one or more grooves 71a inside the outermost groove, among the plurality of grooves 71a.

In one embodiment, the upper surface of the base 18 defines the plurality of grooves 72 (second grooves). The number of grooves 72 in the upper surface of the base 18 may be an arbitrary number of one or more. Upper end openings of the plurality of grooves 72 are covered with the adhesive 21. That is, the upper end openings of the plurality of grooves 72 are closed by the adhesive 21. The plurality of grooves 72 are further away from the center of the upper surface than the supply path 70 within the upper surface of the base 18. That is, the plurality of grooves 72 are further away from the center of the upper surface of the base 18 than all the grooves 71.

In one embodiment, the plurality of grooves 72 communicate with the plurality of grooves 71. In one embodiment, the plurality of grooves 72 extend in the radiation direction with respect to the center of the upper surface of the base 18. In one embodiment, the plurality of grooves 72 extend in the radiation direction from the outermost groove 71a of the plurality of grooves 71a. The plurality of grooves 72 may be disposed at equal intervals in a circumferential direction with respect to the center of the upper surface of the base 18.

In one embodiment, a protective tape 74 may be provided between each of the grooves 72, and the adhesive 21. The protective tape 74 is provided to cover the upper end opening of each of the grooves 72. In this embodiment, the adhesive 21 covers the protective tape 74. In one embodiment, the protective tape 74 is formed from a material that is more easily eroded than the adhesive 21 by a process gas or a plasma of a process gas to be supplied from the gas source group 40. For example, the adhesive 21 is a silicon-based, epoxy-based or acryl-based adhesive, and the protective tape 74 is a tape formed from polyimide. In one embodiment, the protective tape 74 may further cover the plurality of grooves 71. However, the plurality of holes 73 pass through the protective tape 74 on the plurality of grooves 71.

As illustrated in FIG. 4, in the substrate support 14, the adhesive 21 initially closes the upper end openings of the plurality of grooves 72. When the substrate processing (for example, a plasma processing) within the substrate processing apparatus 10 is performed, the adhesive 21 is eroded from the edge thereof. As illustrated in FIG. 5, when the erosion of the adhesive 21 and the protective tape 74 occurs, the upper end opening of at least one groove 72 of the plurality of grooves 72 is exposed. When the upper end opening of at least one groove 72 of the plurality of grooves 72 is exposed, the gas with which the plurality of grooves 72 are filled from the gas source 80 leaks from the groove 72 of which the upper end opening has been exposed. Therefore, by detecting that the pressures in the plurality of grooves 72 decrease from the measured value of the pressure sensor 85 after the gas is supplied to the plurality of grooves 72, it is possible to detect the erosion of the adhesive 21.

Figure 7:
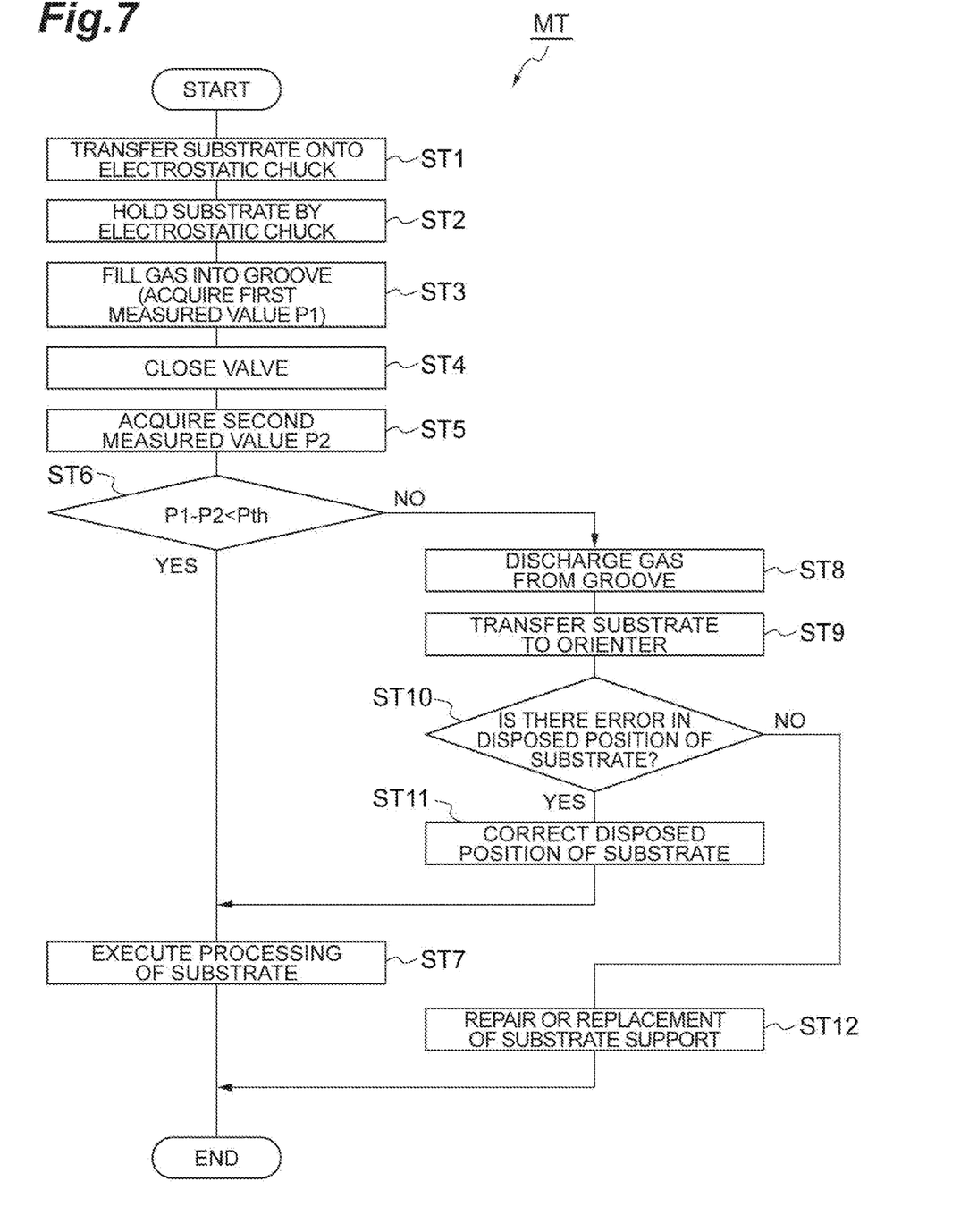
FIG. 7 is a flow chart of a method of detecting erosion of an adhesive in a substrate support according to the one exemplary embodiment.

Hereinafter, a method of detecting erosion of an adhesive in a substrate support according to one exemplary embodiment will be described with reference to FIG. 7. FIG. 7 is a flow chart of a method of detecting erosion of an adhesive in a substrate support according to one exemplary embodiment. Hereinafter, a method MT illustrated in FIG. 7 will be described by taking a case where the system 1 is used as an example. In addition, the control of the respective units of the system 1 by the controller MC will be described.

As illustrated in FIG. 7, in the method MT, first, Step ST1 is executed. In Step ST1, the substrate W is transferred onto the electrostatic chuck 20 of the substrate processing apparatus 10. In one embodiment, in Step ST1, the substrate W is transferred from any of the containers 4a to 4d to a process module, which is the substrate processing apparatus 10, among the process modules PM1 to PM6. In Step ST1, the transfer device TU1 and the transfer device TU2 are controlled by the controller MC to transfer the substrate W onto the electrostatic chuck 20 of the substrate processing apparatus 10.

In the subsequent Step ST2, the substrate W is held by the electrostatic chuck 20. In Step ST2, in order to generate the electrostatic attractive force between the substrate W and the electrostatic chuck 20, the DC power source 22 and the switch 23 are controlled by the controller MC.

In the subsequent Step ST3, the plurality of grooves 72 are filled with the gas from the gas source 80. In Step ST3, the controller MC controls the valve 81 to open the valve 81, and controls the valve 83 to close the valve 83. Further, in Step ST3, a first measured value P1 is acquired. The first measured value P1 indicates the pressure in the plurality of grooves 72 in a state where the plurality of grooves 72 is filled with the gas. In Step ST3, the controller MC acquires the first measured value P1 from the pressure sensor 85.

In the subsequent Step ST4, the valve 81 is closed. In Step ST4, the valve 81 is controlled by the controller MC.

The subsequent Step ST5 is executed after a predetermined time from when the valve 81 is closed in Step ST4. In Step ST5, a second measured value P2 is acquired from the pressure sensor 85 by the controller MC. The second measured value P2 indicates the pressure in the plurality of grooves 72 after the predetermined time from when the valve 81 is closed in Step ST4.

In the subsequent Step ST6, the second measured value P2 is compared with the first measured value P1. The comparison between the first measured value P1 and the second measured value P2 in Step ST6 is performed by the controller MC. The presence/absence of an abnormality is detected by the comparison in Step ST6. In an example, (P1−P2) is determined in Step ST6. In a case where (P1−P2) is lower than a predetermined value Pth, it is determined that no abnormality has occurred, the gas does not leak from the plurality of grooves 72, and the adhesive 21 is not eroded. In Step ST6, when it is determined that no abnormality has occurred, the processing of the substrate W is executed in Step ST7.

On the other hand, when an abnormality is detected in Step ST6, Step ST8 is executed. For example, in a case where (P1−P2) is not less than the predetermined value Pth, Step ST8 is executed. In Step ST8, the gas is discharged from the plurality of grooves 72. Specifically, the valve 83 is opened, and the exhaust device 84 is operated. In Step ST8, the valve 83 and the exhaust device 84 are controlled by the controller MC.

In the subsequent Step ST9, the substrate W is transferred from the substrate processing apparatus 10 to the orienter AN. In Step ST9, the transfer device TU1 and the transfer device TU2 are controlled by the controller MC to transfer the substrate W from the substrate processing apparatus 10 to the orienter AN.

In the subsequent Step ST10, it is determined whether or not an error in the position of the substrate W disposed on the electrostatic chuck 20 has occurred. Specifically, in Step ST10, the position of the substrate W inside the orienter AN is acquired by the controller MC. The controller MC determines a difference between the position of the substrate W acquired from the orienter AN, and a reference position. In a case where it is determined from the determined difference that an error in the position of the substrate W disposed on the electrostatic chuck 20 has occurred, the controller MC corrects the position of the substrate W disposed on the electrostatic chuck 20 in Step ST 11. Thereafter, the processing proceeds to Step ST7.

On the other hand, in Step ST10, in a case where it is determined that no error in the position of the substrate W disposed on the electrostatic chuck 20 has occurred, the controller MC determines that the erosion of the adhesive 21 has occurred, and an alarm is generated. In response to the alarm, in Step ST12, repair or replacement of the substrate support 14 of the support assembly is performed.

Figure 8:
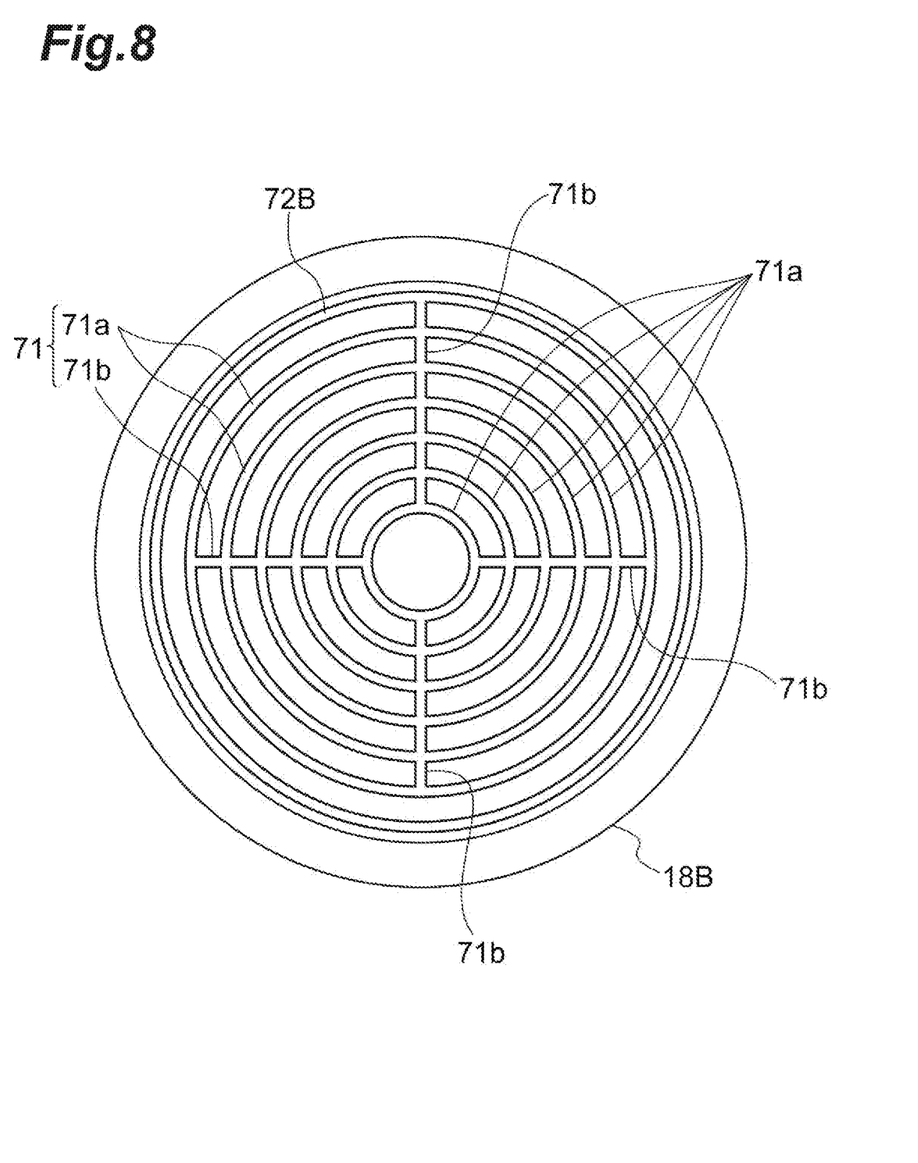
FIG. 8 is a plan view illustrating an upper surface of a base of a substrate support according to an other exemplary embodiment.
Figure 9:
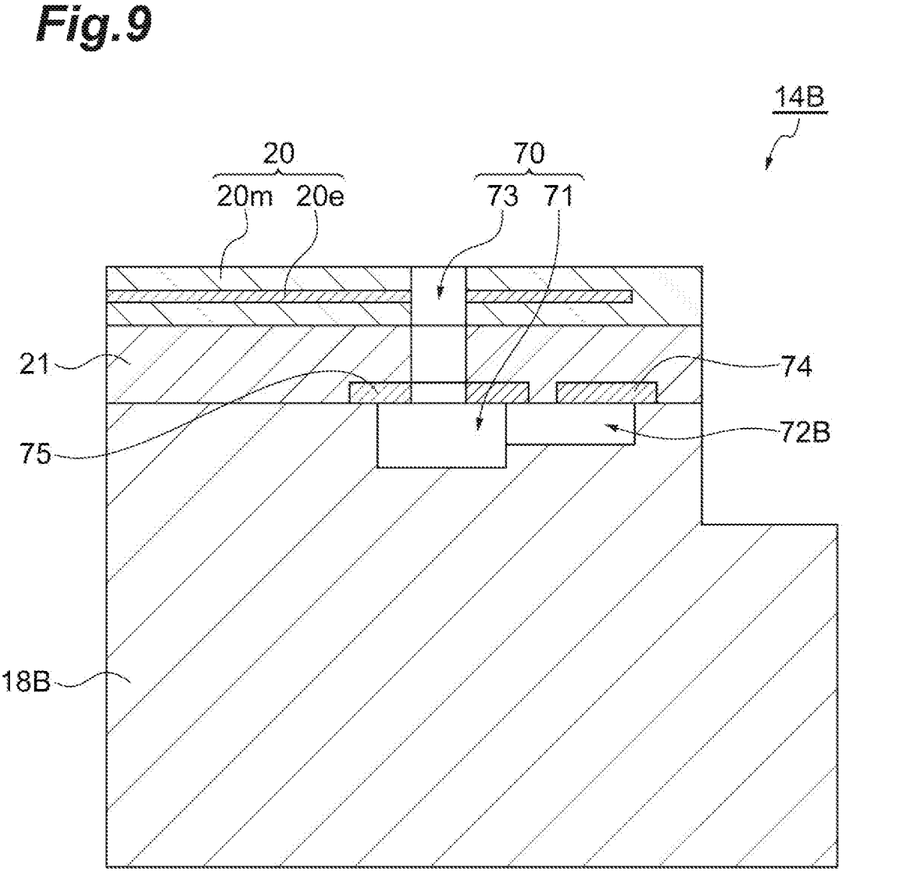
FIG. 9 is a partially enlarged sectional view of the substrate support according to the other exemplary embodiment.

Hereinafter, a substrate support according to still another exemplary embodiment will be described with reference to FIGS. 8 and 9. FIG. 8 is a plan view illustrating an upper surface of a base of a substrate support according to an other exemplary embodiment. FIG. 9 is a partially enlarged sectional view of the substrate support according to the other exemplary embodiment. A substrate support 14B illustrated in FIGS. 8 and 9 can be adopted in the substrate processing apparatus 10, instead of the substrate support 14. Hereinafter, the configuration of the substrate support 14B different from the corresponding configuration of the substrate support 14 will be described.

The substrate support 14B has a base 18B, instead of the base 18. An upper surface of the base 18B defines a groove 72B, instead of the grooves 72. In other respects, the configuration of the base 18B is the same as the configuration of the base 18. The groove 72B of the base 18B has a ring shape. The groove 72B is provided outside the outermost groove 71a of the plurality of grooves 71a in a radial direction. The groove 72B extends in the circumferential direction around the center of the upper surface of the base 18B. The groove 72B communicates with the plurality of grooves 71a via grooves 71b.

An upper end opening of the groove 72B is covered with the adhesive 21. In one embodiment, the protective tape 74 may be provided between the groove 72B and the adhesive 21. The protective tape 74 is provided to cover the upper end opening of the groove 72B. In this embodiment, the adhesive 21 covers the protective tape 74. In one embodiment, a protective tape 75 may cover the grooves 71. The protective tape 75 may be formed from the same material as the protective tape 74. On the grooves 71, the plurality of holes 73 pass through the protective tape 75.

Even in a case where the substrate support 14B is used, the adhesive 21 is eroded from the edge thereof. When the adhesive 21 is eroded, the erosion of the protective tape 74 also occurs, and the upper end opening of the groove 72B is exposed. When the upper end opening of the groove 72B is exposed, the gas with which the groove 72B is filled from the gas source 80 leaks from the groove 72B. Therefore, by detecting that the pressure in the groove 72B decreases from the measured value of the pressure sensor 85 after the gas is supplied to the groove 72B, it is possible to detect the erosion of the adhesive 21.

Figure 10:
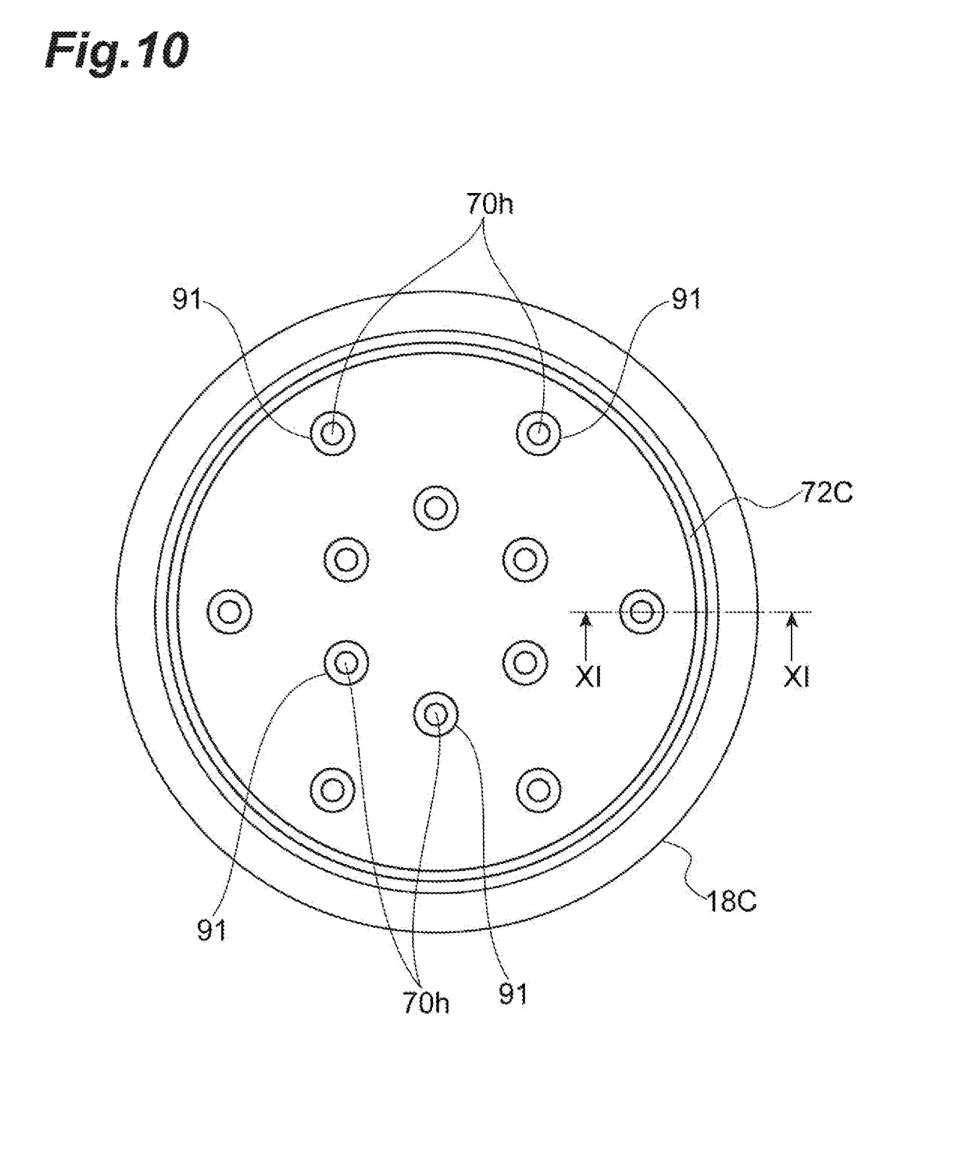
FIG. 10 is a plan view illustrating an upper surface of a base of a substrate support according to still another exemplary embodiment.
Figure 11:
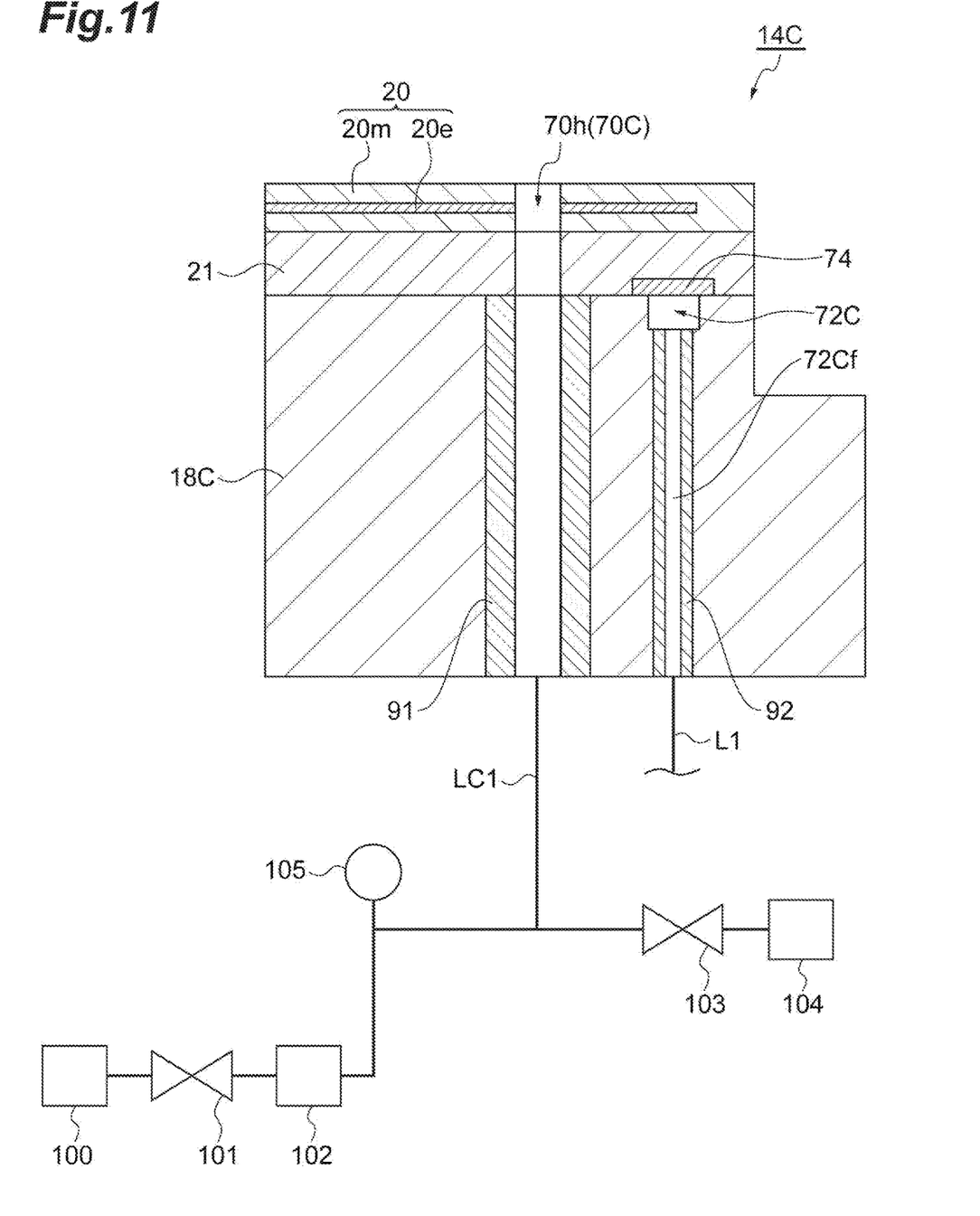
FIG. 11 is a partially enlarged sectional view of the substrate support according to the still other exemplary embodiment.

Hereinafter, a substrate support according to still another exemplary embodiment will be described with reference to FIGS. 10 and 11. FIG. 10 is a plan view illustrating an upper surface of a base of a substrate support according to still another exemplary embodiment. FIG. 11 is a partially enlarged sectional view of the substrate support according to the still other exemplary embodiment. A substrate support 14C illustrated in FIGS. 10 and 11 can be adopted in the substrate processing apparatus 10, instead of the substrate support 14. Hereinafter, the configuration of the substrate support 14C different from the corresponding configuration of the substrate support 14 will be described.

The substrate support 14C has a base 18C, instead of the base 18. The base 18C, the electrostatic chuck 20, and the adhesive 21 of the substrate support 14C provide a supply path 70C, instead of the supply path 70. The supply path 70C includes a plurality of flow paths 70h. The plurality of flow paths 70h pass through the base 18C, the adhesive 21, and the electrostatic chuck 20. In one embodiment, the plurality of flow paths 70h extend in a vertical direction. Each of the plurality of flow paths 70h is provided by a cylindrical sleeve 91 within the base 18C.

A gas line LC1 is connected to the plurality of flow paths 70h. A gas source 100 is connected to the gas line LC via a valve 101 and a flow rate controller 102. The gas source 100 is a source for the heat transfer gas (for example, helium gas). The flow rate controller 102 is a massflow controller or a pressure-controlled flow rate controller. When the valve 101 is opened, the heat transfer gas is supplied between the electrostatic chuck 20, and the back surface of the substrate W via the gas line LC1 and the plurality of flow paths 70h of the supply path 70C. An exhaust device 104 is connected to the gas line LC1 via a valve 103. A pressure sensor 105 is connected to the gas line LC1. The pressure sensor 105 is configured to acquire a measured value of the pressure in the gas line LC1.

An upper surface of the base 18C defines a groove 72C, instead of the grooves 72. The groove 72C is separated from the supply path 70C. The groove 72C has a ring shape, and extends in the circumferential direction around the center of the upper surface of the base 18C. In addition, within the base 18C, the plurality of flow paths 70h extend in the vertical direction inside the groove 72C. A flow path 72Cf is provided in the base 18C. The flow path 72Cf communicates with the groove 72C. The gas line L1 illustrated in FIG. 6 is connected to the flow path 72Cf. The flow path 72Cf is provided by a cylindrical sleeve 92.

The groove 72C is covered with the adhesive 21. In one embodiment, the protective tape 74 may be provided between the groove 72C and the adhesive 21. The protective tape 74 is provided to cover an upper end opening of the groove 72C. In this embodiment, the adhesive 21 covers the protective tape 74.

Even in a case where the substrate support 14C is used, the adhesive 21 is eroded from the edge thereof. When the adhesive 21 is eroded, the erosion of the protective tape 74 also occurs, and the upper end opening of the groove 72C is exposed. When the upper end opening of the groove 72C is exposed, the gas with which the groove 72C is filled from the gas source 80 leaks from the groove 72C. Therefore, by detecting that the pressure in the groove 72C decreases from the measured value of the pressure sensor 85 after the gas is supplied to the groove 72C, it is possible to detect the erosion of the adhesive 21.

While various exemplary embodiments have been described above, various omissions, substitutions, and changes may be made without being limited to the exemplary embodiments described above. Elements of the different embodiments may be combined to form another embodiment.

In another embodiment, the substrate processing apparatus may be any type of a plasma processing apparatus, such as an inductively coupled plasma processing apparatus or a plasma processing apparatus that generates a plasma using surface waves, such as microwaves. In still another embodiment, the substrate processing apparatus may be a substrate processing apparatus other than the plasma processing apparatus.

The gas to be supplied between the substrate W and the electrostatic chuck 20 and the gas to be supplied to the grooves (72, 72B, 72C) provided in the upper surface of the base in order to detect the erosion of the adhesive may be different from each other.

Additionally, the method MT may be executed in the system 1 including the substrate processing apparatus 10 that includes the substrate support 14B or the substrate support 14C.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate support comprising:
   a base;
   an electrostatic chuck provided on the base; and
   an adhesive provided between an upper surface of the base and a lower surface of the electrostatic chuck,
   wherein the base, the adhesive, and the electrostatic chuck provide a supply path for supplying a heat transfer gas between the electrostatic chuck and a substrate placed on the electrostatic chuck,
   wherein the upper surface of the base defines one or more grooves,
   wherein the one or more grooves are further away from a center of the upper surface than the supply path within the upper surface of the base, wherein the adhesive is provided to cover an upper end opening of each of the one or more grooves, wherein the heat transfer gas or another gas is capable of being supplied to the one or more grooves via the supply path or a flow path different from the supply path, and wherein the substrate support further comprises a pressure sensor to measure a pressure in the one or more grooves.

2. The substrate support according to claim 1, wherein a protective tape is provided between each of the one or more grooves and the adhesive to cover the upper end opening of each of the one or more grooves, and wherein the adhesive covers the protective tape.

3. The substrate support according to claim 1, wherein the one or more grooves are a plurality of grooves, and extend in a radial direction with respect to the center of the upper surface of the base.

4. The substrate support according to claim 1, wherein the one or more grooves have a ring shape, and extend in a circumferential direction around the center of the upper surface of the base.

5. The substrate support according to claim 1, wherein the upper surface of the base defines a first groove that is a portion of the supply path and one or more second grooves that are the one or more grooves.

6. The substrate support according to claim 5, wherein the one or more second grooves communicates with the first groove.

7. The substrate support according to claim 1, wherein the one or more grooves are separated from the supply path.

8. A substrate processing apparatus comprising:

a chamber; and the substrate support according to claim 1 configured to support a substrate in the chamber.

9. The substrate processing apparatus according to claim 8 that is a plasma processing apparatus.

10. The substrate processing apparatus according to claim 8, further comprising:

a gas source;

a valve connected between the one or more grooves and the gas source; and a controller configured to control the valve, wherein the controller is configured to control the valve to close the valve in a state where the one or more grooves are filled with the gas from the gas source, and acquire a measured value of a pressure in the one or more grooves from the pressure sensor in a state where the valve is closed.

11. The substrate processing apparatus according to claim 10, wherein the controller is configured to acquire a first measured value of the pressure in the one or more grooves in the state where the one or more grooves are filled with the gas from the gas source, and compare a second measured value, which is the measured value acquired from the pressure sensor in the state where the valve is closed, with the first measured value.

12. A substrate processing system comprising:

the substrate processing apparatus according to claim 11;

an orienter configured to acquire a position of a substrate therein; and a transfer device configured to transfer a substrate between the chamber and the orienter, wherein the upper surface of the base defines a first groove that is a portion of the supply path, and one or more second grooves that are the one or more grooves, and the one or more second grooves communicate with the first groove, and wherein the controller is configured to control the transfer device to transfer a substrate placed on the electrostatic chuck to the orienter in a case where it is determined that a gas leaks from the first groove or the one or more second grooves as a result of comparison between the first measured value and the second measured value, and determine whether or not an error in a position of the substrate disposed on the electrostatic chuck has occurred, based on the position of the substrate within the orienter acquired by the orienter.

13. A method of detecting erosion of an adhesive in the substrate support according to claim 1, comprising:

closing a valve in a state where one or more grooves of the substrate support are filled with a gas from a gas source, the valve being connected between the one or more grooves and the gas source, and acquiring a measured value of a pressure in the one or more grooves from the pressure sensor in a state where the valve is closed.

14. The method according to claim 13, further comprising:

acquiring a first measured value of the pressure in the one or more grooves in the state where the one or more grooves are filled with the gas from the gas source, and comparing a second measured value, which is the measured value acquired from the pressure sensor in the state where the valve is closed, with the first measured value.

15. The method according to claim 14, wherein the upper surface of the base defines a first groove that is a portion of the supply path, and one or more second grooves that are the one or more grooves, and the one or more second grooves communicate with the first groove, the method further comprising:

transferring the substrate placed on the electrostatic chuck to an orienter in a case where it is determined that the gas leaks from the first groove or the one or more second grooves as a result of comparison between the first measured value and the second measured value, and determining whether or not an error in a position of the substrate disposed on the electrostatic chuck has occurred, based on the position of the substrate within the orienter acquired by the orienter.

* * * * *